United States Patent
Becker et al.

(10) Patent No.: US 10,732,519 B2
(45) Date of Patent: Aug. 4, 2020

(54) MIRROR BLANK FOR EUV LITHOGRAPHY WITHOUT EXPANSION UNDER EUV RADIATION

(71) Applicant: Heraeus Quarzglas GmbH & Co. KG, Hanau (DE)

(72) Inventors: Klaus Becker, Hanau (DE); Stephan Thomas, Großkrotzenburg (DE)

(73) Assignee: Heraeus Quarzglas GmbH & Co. KG, Hanau (DE)

( * ) Notice: Subject to any disclaimer, the term of this patent is extended or adjusted under 35 U.S.C. 154(b) by 0 days.

(21) Appl. No.: 15/024,236

(22) PCT Filed: Sep. 10, 2014

(86) PCT No.: PCT/EP2014/069302
§ 371 (c)(1),
(2) Date: Apr. 29, 2016

(87) PCT Pub. No.: WO2015/043957
PCT Pub. Date: Apr. 2, 2015

(65) Prior Publication Data
US 2016/0320715 A1  Nov. 3, 2016

(30) Foreign Application Priority Data
Sep. 30, 2013 (DE) .......... 10 2013 219 808

(51) Int. Cl.
*G03F 7/20* (2006.01)
*C03C 3/06* (2006.01)
(Continued)

(52) U.S. Cl.
CPC ...... *G03F 7/70958* (2013.01); *C03B 19/1415* (2013.01); *C03B 19/1453* (2013.01);
(Continued)

(58) Field of Classification Search
CPC ... G02B 7/008; G02B 5/0891; G03F 7/70958; C03B 19/1415; C03B 19/1453;
(Continued)

(56) References Cited

U.S. PATENT DOCUMENTS 7,928,026 B2 * 4/2011 Bookbinder ............. C03C 3/06
501/54
8,870,396 B2  10/2014 Kaller et al.
(Continued)

FOREIGN PATENT DOCUMENTS

DE  102006034176 A1  11/2007
DE  102010009589 A1  9/2011
(Continued)

OTHER PUBLICATIONS

Office Action dated Sep. 18, 2014 in DE Application No. 102013219808.6.
(Continued)

*Primary Examiner* — Deoram Persaud
(74) *Attorney, Agent, or Firm* — Panitch Schwarze Belisario & Nadel LLP

(57) ABSTRACT

A substrate for an EUV mirror which contains a zero crossing temperature profile that departs from the statistical distribution is provided. A method for producing a substrate for an EUV mirror is also provided, in which the zero crossing temperature profile in the substrate is adapted to the operating temperature of the mirror. A lithography method using the substrate is also described.

20 Claims, 3 Drawing Sheets

(51) Int. Cl.
*G02B 7/00* (2006.01)
*C03B 32/00* (2006.01)
*G02B 5/08* (2006.01)
*C03B 19/14* (2006.01)

(52) U.S. Cl.
CPC ............... *C03B 32/00* (2013.01); *C03C 3/06* (2013.01); *G02B 5/0891* (2013.01); *G02B 7/008* (2013.01); *C03B 2201/12* (2013.01); *C03B 2201/23* (2013.01); *C03B 2201/42* (2013.01); *C03C 2201/42* (2013.01)

(58) Field of Classification Search
CPC ............ C03B 2201/12; C03B 2201/23; C03B 2201/42; C03B 32/00; C03C 2201/42; C03C 3/06
See application file for complete search history.

(56) References Cited

U.S. PATENT DOCUMENTS

| | | | | |
|---|---|---|---|---|
| 9,382,151 | B2* | 7/2016 | Angell, IV | G03F 1/60 |
| 9,580,350 | B2* | 2/2017 | Annamalai | C03C 3/076 |
| 2005/0207001 | A1* | 9/2005 | Laufer | G02B 1/00 |
| | | | | 359/350 |
| 2006/0008749 | A1* | 1/2006 | Sobel | B82Y 10/00 |
| | | | | 430/394 |
| 2006/0276323 | A1* | 12/2006 | Iwahashi | C03B 19/1415 |
| | | | | 501/54 |
| 2007/0134566 | A1* | 6/2007 | Maida | C03B 19/1484 |
| | | | | 430/5 |
| 2010/0028787 | A1* | 2/2010 | Koike | B82Y 10/00 |
| | | | | 430/5 |
| 2010/0261597 | A1* | 10/2010 | Koike | C03B 19/1453 |
| | | | | 501/53 |
| 2011/0159413 | A1* | 6/2011 | Maida | B82Y 10/00 |
| | | | | 430/5 |
| 2012/0264584 | A1 | 10/2012 | Miyasaka et al. | |
| 2013/0120863 | A1* | 5/2013 | Kaller | C03B 19/06 |
| | | | | 359/838 |
| 2013/0141707 | A1* | 6/2013 | Baer | G03F 7/70316 |
| | | | | 355/67 |
| 2014/0300876 | A1 | 10/2014 | Baer et al. | |
| 2015/0376048 | A1* | 12/2015 | Becker | C03B 19/066 |
| | | | | 501/53 |
| 2015/0376049 | A1* | 12/2015 | Thomas | C03B 25/02 |
| | | | | 501/54 |
| 2016/0011521 | A1* | 1/2016 | Bittner | G03F 7/70891 |
| | | | | 355/45 |
| 2016/0041480 | A1* | 2/2016 | Hauf | G03F 7/70266 |
| | | | | 355/30 |

FOREIGN PATENT DOCUMENTS

| | | |
|---|---|---|
| DE | 102010028488 A1 | 11/2011 |
| DE | 102010009589 B4 | 12/2011 |
| DE | 102011085358 B3 | 7/2012 |
| DE | 102012201075 A1 | 7/2013 |
| DE | 102015113485 A1 | 9/2016 |
| EP | 2581571 A1 | 4/2013 |
| JP | S52101695 A | 8/1977 |
| JP | H0388743 A | 4/1991 |
| JP | H10317995 A | 12/1998 |
| JP | 2006096608 A | 4/2006 |
| JP | 2010013335 A | 1/2010 |
| JP | 2011151386 A | 8/2011 |
| WO | 2008038083 A2 | 4/2008 |
| WO | 2009142989 A2 | 11/2009 |
| WO | 2011078414 A2 | 6/2011 |
| WO | 2011104257 A1 | 9/2011 |
| WO | 2013110518 A1 | 8/2013 |
| WO | 2013132589 A1 | 9/2013 |

OTHER PUBLICATIONS

International Search Report (with English translation) and Written Opinion dated Dec. 2, 2014 in International Application No. PCT/EP2014/069302.

Makishima et al., "Glass Materials Design System: VitrES", Fujitsu Japanese Edition, 44(6), pp. 560-565, 1993 (English Abstract Only).

Office Action dated Nov. 2, 2018 in CN Application No. 201480053715.1.

Office Action dated Jul. 3, 2019 in CN Application No. 201480053715.1.

Office Action dated Jan. 22, 2020 in DE Application No. 102013219808.6 (with Partial Machine English Translation).

Extended European Search Report dated Jan. 23, 2019 in EP Application No. 18205070.8.

* cited by examiner

MIRROR BLANK FOR EUV LITHOGRAPHY WITHOUT EXPANSION UNDER EUV RADIATION

CROSS-REFERENCE TO RELATED APPLICATIONS

This application is a Section 371 of International Application No. PCT/EP2014/069302, filed Sep. 10, 2014, which was published in the German language on Apr. 2, 2015 under International Publication No. WO 2015/043957 A1 and the disclosure of which is incorporated herein by reference.

BACKGROUND OF THE INVENTION

In EUV lithography, highly integrated structures are generated by electromagnetic radiation. The wavelength of the radiation used for this purpose is in a range of approximately 13 nm, i.e., in the range of extreme ultraviolet light (EUV). EUV mirrors are used in EUV projection systems and comprise at least one substrate and one reflective multilayer coating that is applied onto the substrate. For this purpose, the substrate regularly comprises a zero-expansion material and location-independent zero crossing temperatures of thermal expansion in the substrate. Upon exposure to an extreme ultraviolet radiation in an EUV projection system, the EUV mirror comprises location-dependent operating temperatures.

The mirror substrates usually consists of glass that has a high silicic acid content and is doped with titanium dioxide. The actual mirror is obtained by mechanical processing and coating of the substrate with a multilayer coating. The maximal (theoretical) reflectivity of an EUV mirror element in this context is approximately 70%, such that approximately 30% of the radiation energy is absorbed and converted into heat in the coating or in the mirror substrate layers close to the surface. The radiation penetrating into the mirror substrate elicits thermal changes of the substrate volume, which can be associated with surface deformations. Even minute volume changes with a magnitude of 1 nm can lead to noticeable deterioration and distortion of the imaging quality. The surface region around the impact surface of the radiation is particularly strongly strained in this context.

DE 10 2010 009 589 B4 describes a method for producing a blank made of titanium-doped glass with a high silicic acid content for a mirror substrate for use in EUV lithography. The mirror substrate comprises a surface region that is to be mirror coated, whereby the glass for said surface region is produced by flame hydrolysis and a pre-defined hydrogen content is established.

US 2012/0264584 A1 discloses a substrate for an EUV lithography projection system comprising two different surfaces whose zero crossing temperatures differ by at least 5° C.

DE 10 2011 085 358 B3 relates to an optical arrangement for EUV lithography and a method for the configuration thereof. In this context, the optical arrangement, for example a projection objective lens, comprises two mirror substrates having different thermal expansion coefficients that are each arranged appropriately such that the distortion caused by deformation of the mirrors is compensated.

BRIEF SUMMARY OF THE INVENTION

The present invention relates to a substrate for an EUV mirror containing a surface, characterized in that the distribution of the zero crossing temperature at the substrate surface used for optical purposes departs from the statistical distribution, and in which the substrate comprises a minimal and a maximal zero crossing temperature, each at the surface. The invention also relates to a method for producing a substrate for an EUV mirror, in which an inhomogeneous nominal temperature profile of the zero crossing temperature is pre-defined, as well as to the use of the inventive substrates in photolithography.

BRIEF DESCRIPTION OF THE SEVERAL VIEWS OF THE DRAWINGS

The foregoing summary, as well as the following detailed description of the invention, will be better understood when read in conjunction with the appended drawings. For the purpose of illustrating the invention, there are shown in the drawings embodiments which are presently preferred. It should be understood, however, that the invention is not limited to the precise arrangements and instrumentalities shown.

In the drawings.

DETAILED DESCRIPTION OF THE INVENTION

Figure 1:
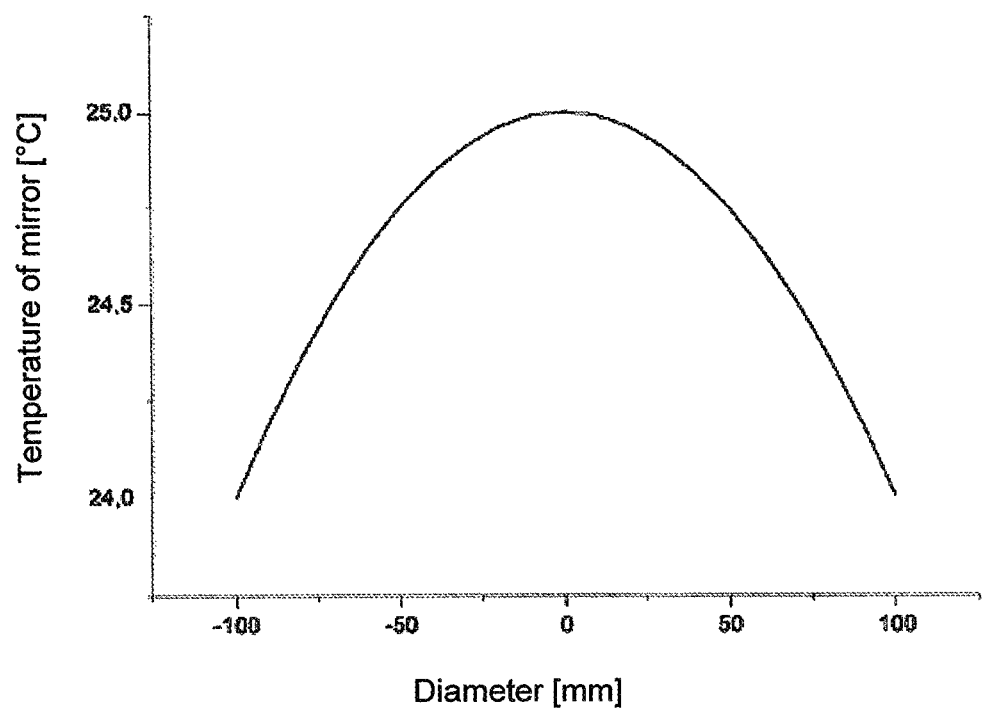
FIG. 1 is a graph of temperature v. diameter of an irradiated EUV mirror according to an embodiment of the invention.

There is an increasing need to provide EUV mirror substrates that are well-suited for use in EUV mirrors and enable precise processing of micro-electronic components, for example integrated circuits, in particular in the semiconductor industry. It is therefore an object of the present invention to provide a substrate for an EUV mirror, and a method for producing the substrate, which comprises no or only minimal expansion under defined EUV irradiation conditions, for example upon use in EUV lithography methods, and thus enables high imaging quality.

The object is solved according to the invention in that the location-dependent zero crossing temperatures of the substrate vary over the surface of the substrate and have an inhomogeneous, non-statistical distribution imparted on them. In an ideal case, this distribution matches the expected operating temperature of the mirror.

Accordingly, one subject matter of the present invention is a substrate for an EUV mirror that comprises zero crossing temperatures at the surface which depart from the statistical distribution, whereby the substrate comprises a minimal zero crossing temperature ($T_{zcmin}$) and a maximal zero crossing temperature ($T_{zcmax}$) at the surface that differ from each other by more than 1.5 K.

In the scope of the present invention, a distribution departing from the statistical distribution shall be understood to be a non-arbitrary, non-linear, inhomogeneous distribution. Preferably, the zero crossing temperature follows a defined profile and/or a defined distribution that is based on the expected profile and/or the expected distribution of the operating temperature of the mirror.

The surface of the substrate is provided with a reflective multilayer coating in an EUV mirror that can be referred to as the surface of the mirror. The surface of the mirror is directly exposed to the operating conditions. In the scope of the present invention, the surface of the substrate shall be understood to mean the surface of the substrate that faces the multilayer coating in an EUV mirror. "Surface" in the scope of the invention shall include both a two-dimensional dimension and a volume element. Provided the term "surface of the substrate" refers to a volume element, the volume element is preferably an element comprising a thickness of, for example, 2 cm to 4 cm and forms the outer boundary of the substrate that faces the operation.

In the scope of the present invention, a substrate shall be understood to be a form body that corresponds to a precursor and/or blank of the actual EUV mirror. The actual EUV mirror can be produced from this precursor by further procedural steps, for example by applying a concave mirror shape and polishing and reflexive coating thereof.

Due to their exposure to short wavelength radiation, the materials requirements of substrates used in EUV lithography are high. One group of materials meeting these high requirements are doped quartz glasses. Moreover, the properties of the quartz glass can be adapted to the existing requirements by introducing different doping agents. For example, the refractive index or the viscosity of the glass can be varied through appropriate selection of the doping agents. Doping with titanium dioxide, in particular, contributes to further minimization of the thermal expansion of the quartz glass.

Therefore, an embodiment of the present invention, in which the substrate comprises titanium oxide-doped quartz glass, is preferred.

In a preferred embodiment of the present invention, the substrate comprises 5% by weight to 12% by weight, preferably 6% by weight to 10% by weight, titanium dioxide, each relative to the total weight of the substrate.

Obviously, the substrate can contain further doping agents. For example alkali metals, inter alia, can be used to reduce the impact of "Schlieren" in the substrate. Moreover, further doping agents can be used to adapt the viscosity or the refractive index of the substrate according to the operating conditions.

In a further preferred embodiment, the substrate comprises glass ceramic materials, in which the ratio of the crystal phase to the glass phase is adjusted appropriately such that the thermal expansion coefficients of the different phases virtually cancel each other.

It has proven to be advantageous for the substrate to be composed of layers. The layers may differ by their zero crossing temperature, the distribution of the zero crossing temperature, or other properties, such as bubbles. Therefore, an embodiment of the present invention, in which the substrate comprises multiple layers, is preferred. The thicknesses of the individual layers can vary in this context and may be selected freely, taking into consideration the desired properties of the substrate. The number of layers may be, for example, in the range of from 2 to 4 in this context.

Exposure of the mirrors to EUV radiation causes the mirror to heat up, whereby the mirror, due to an inhomogeneous illumination by a spread out EUV beam spot, which has a spatial intensity distribution, comprises a temperature distribution and/or a temperature profile that is a function of the impact surface and/or of the intensity distribution of the EUV beam spot. This temperature profile is present, analogously, on the surface of the substrate. In this context, the beam spot can irradiate the entire surface of the mirror or just a part thereof.

In order to counteract thermal deformations of the substrate and/or mirror, it is therefore desirable that the distribution of the zero crossing temperature be matched to the temperature profile and/or the temperature distribution. Accordingly, an embodiment is preferred in which the surface of the substrate comprises different zero crossing temperatures, whereby the zero crossing temperature preferably comprises at least one peak.

Therefore, an embodiment is preferred in which the substrate comprises a zero crossing temperature $T_{zc1}$ in the regions far from the edge and a zero crossing temperature $T_{zc2}$ at the edge, whereby $T_{zc1}$ is at least 1.5° C. higher than $T_{zc2}$.

In practical applications, the EUV radiation field usually comprises one or more intensity peaks. This results in a temperature profile that is essentially characterized in that different locations comprise different temperatures and, as a consequence, the zero crossing temperatures are also different, and in that the surface of the substrate has a maximal and a minimal zero crossing temperature. Provided the radiation impinging on the EUV mirror comprises multiple intensity peaks, the temperature distribution on the EUV mirror surface also comprises multiple peaks, whereby the peaks on the surface of the mirror correspond to the intensity peaks of the radiation.

Accordingly, an embodiment in which the difference between $T_{zcmax}$ and $T_{zcmin}$ is at least 2 K, more preferably 3 K, is preferred.

Furthermore, an embodiment of the substrate in which the difference between $T_{zcmax}$ and $T_{zcmin}$ is in a range of from 2 to 10 K, in particular of from 2.5 to 7 K, is preferred.

The common operating conditions to which the substrate is exposed usually result in there being at least one location on the surface of the substrate at which the substrate comprises a maximal temperature. Therefore, an embodiment in which the distribution of the zero crossing temperatures at the surface of the substrate has at least one local peak is preferred.

Furthermore, an embodiment in which the distribution of the zero crossing temperature comprises, at least partly, an essentially steady profile is preferred. Accordingly, the zero crossing temperature may, for example decrease steadily from the center of the impact surface of the EUV radiation field toward the outside. The temperature distribution on the surface of the mirror to which the distribution of the zero crossing temperature on the surface of the substrate is matched usually results from the interplay between the heating of the mirror due to irradiation by an EUV radiation field and heat dissipation to the surroundings. Moreover, it is feasible to exert an influence on the temperature distribution through deliberate cooling of the mirror.

Substrates employed in EUV lithography must meet strict requirements. The substrates must possess properties such as, for example, thermal expansion coefficients or zero crossing temperatures, which necessitate precise adjustment of the properties and careful production of the substrate.

Accordingly, another subject matter of the present invention is a method for producing a substrate for an EUV mirror comprising the following steps:
 a) pre-defining an inhomogeneous nominal temperature profile of the zero crossing temperature for the substrate; and b) producing the substrate while adjusting the pre-defined location-dependent nominal profile of the zero crossing temperature.

In the scope of the invention, "nominal temperature profile" shall be understood to mean a temperature profile that is defined prior to production of the substrate. The definition in this context can be made through measurements or calculations. This nominal temperature profile is based, for example, on the expected operating temperatures of the mirror, which can vary as a function of the radiation source, number and arrangement of the radiation sources, and further process conditions. The distribution of the zero crossing temperature in the later substrate is matched to this profile. In this context, the matching is preferably done appropriately such that the substrate comprises no thermal deformations under operating conditions. The deformations, which occur customarily, are largely compensated for by appropriate adjustment of the zero crossing temperatures in the substrate and/or on its surface.

In a preferred embodiment, the profile of the nominal temperature extends laterally. In the scope of the invention, a lateral profile shall be understood to mean a profile in which the nominal temperature follows a defined temperature profile on the surface of the substrate.

In a preferred embodiment, the method according to the invention comprises the following steps:
  i) depositing silicon-containing starting substances and titanium-containing starting substances while forming a $TiO_2$-doped soot body;
  ii) drying the soot body;
  iii) sintering the soot body while forming a blank;
  iv) homogenizing the blank and, if applicable,
  v) forming a substrate.

In the scope of the present invention, a soot body shall be understood to mean a porous, non-sintered body made of quartz glass.

In the scope of the present invention, a blank shall be understood to mean a sintered work-piece made of quartz glass that is intended to be processed further. In this context, further processing can comprise forming methods.

Preferably, the silicon-containing starting substance is selected from the group consisting of octamethylcyclotetrasiloxane (OMCTS) and silicon tetrachloride ($SiCl_4$).

The titanium-containing starting substance is preferably selected from the group consisting of titanium isopropoxide [$Ti(O^iPr)_4$] and titanium tetrachloride ($TiCl_4$).

The silicon-containing starting substance and the titanium-containing starting substance can be deposited by common methods known according to the prior art. Preferably, the deposition is effected by flame hydrolysis, particularly preferably by CVD, OVD or VAD methods.

In a further procedural step, the soot body obtained in step i) is dried. The drying in this context can proceed at normal pressure (1 bar) or at reduced pressure. Moreover, the drying can proceed in the presence of inert gases, such as, for example, nitrogen or noble gases. It is feasible just as well to effect the drying in an oxidizing atmosphere, for example in order to prevent reduction reactions converting $Ti^{4+}$ into $Ti^{3+}$, since $Ti^{3+}$ leads to the later substrate having reduced transmission. In order to attain an improved drying effect, the drying can be effected in a chlorine-containing atmosphere, if applicable.

Preferably, the soot body is sintered in step iii) at temperatures in the range of 1,000 to 1,700° C., preferably in a range of 1,300 to 1,500° C.

After homogenization of the blank, the blank may, if applicable, be processed further into a substrate, for example by forming methods or further procedural steps.

For adjusting the distribution of the zero crossing temperature, an embodiment in which the starting substances are deposited layer-by-layer on a cylinder-shaped blank is preferred. By this means, the profile of the zero crossing temperature on the later surface of the substrate can be adjusted according to defined specifications.

It has been evident that the distribution of the zero crossing temperature is a function, inter alfa, of the $TiO_2$ concentration in the substrate. It is therefore feasible to exert an influence of the zero crossing temperature on the distribution by varying the $TiO_2$ content. Therefore, an embodiment of the method according to the invention, in which the quantity of the titanium-containing starting substance is varied during the deposition process, is preferred.

The distribution of the zero crossing temperature preferably follows a non-statistical distribution. Accordingly, an embodiment is preferred in which the adjustment of the distribution of the zero crossing temperature is effected through a doping with titanium oxide that departs from the statistical distribution.

Moreover, it has been evident that the zero crossing temperatures of a substrate and the distribution thereof can be influenced by the OH content in the soot body. Accordingly, an embodiment is preferred in which the adjustment of the distribution of the zero crossing temperature is effected through a distribution of the OH content in the soot body that departs from the statistical distribution.

Due to diffusion processes while the soot body is drying, the soot body usually comprises an OH content distribution which shows a peak in the center of the wall and decreases toward the surfaces. Therefore, appropriate selection of the process parameters, such as temperature, time and pressure, exerts an appropriate influence on the OH profile such that it is made to correspond to the previously defined and desired specifications in terms of the zero crossing temperature profile.

Furthermore, an embodiment of the present invention is preferred in which the adjustment of the distribution of the zero crossing temperature is effected through a distribution of a halogen co-doping agent that departs from the statistical distribution. For example, silicon tetrafluoride ($SiF_4$), tetrafluoromethane ($CF_4$) and hexafluoroethane ($C_2F_6$) are well-suited halogen co-doping agents. The halogen co-doping agent can be introduced, for example, during the drying process.

In a further preferred embodiment, the adjustment of the profile of the zero crossing temperature is effected through the fictive temperatures of the substrate. In the scope of the present invention, fictive temperature shall be understood to mean the temperature below which the bonding angles no longer change during a cooling process in the glass, i.e., the bonding angles are "frozen" at the corresponding fictive temperature.

It has been evident that the fictive temperature may be influenced by targeted measures during the cooling process. Therefore, the adjustment of the fictive temperatures is preferably effected through heat treatment with rings, artificial over-dimensioning, and/or forced cooling. It is particularly preferred to adjust the fictive temperature appropriately such that its profile follows a previously defined profile which corresponds to the desired profile of the zero crossing temperature in the later substrate.

The substrate according to the invention and a substrate obtainable according to the method according to the invention are characterized by their low degree of thermal deformation. Therefore, another subject matter of the present invention is the use of the substrate according to the invention or of a substrate obtained according to the method of the invention for an EUV mirror or in a lithography method, for example an EUV lithography method, preferably for manufacturing electric circuits or printed conductors.

Regarding the use of EUV mirrors in lithography processes, it is desirable to have the mirrors not be subject to deformation during the process, since this may impair the imaging quality. Accordingly, the substrate serving as the basis of the mirror must be characterized by high shape stability even upon heating.

Therefore, an embodiment is preferred in which the use of the substrate according to the invention or of a substrate obtained according to the method of to the invention is characterized in that the profile of the zero crossing temperature in the substrate is adapted to the profile of the operating temperature of the mirror. This ensures that possible deformations of the mirror are compensated for by the substrate such that no overall shape change is observed.

Another subject matter of the present invention is a lithography method comprising the following steps:
 a) providing an EUV mirror having a substrate and
 b) providing at least one radiation source, which, in operation, acts on the EUV mirror, whereby the distribution and/or profile of the zero crossing temperature in the substrate is adapted to the profile of the operating temperature of the mirror.

Preferably, the distribution and/or profile of the zero crossing temperature in the substrate is adapted appropriately to the profile of the operating temperature such that the mirror comprises no overall shape changes.

Referring to the figures, FIG. 1 is a profile of the operating temperature of an EUV mirror irradiated in the center along an axis extending through the center of the substrate, whereby the mirror heats up mainly in the center.

Figure 2:
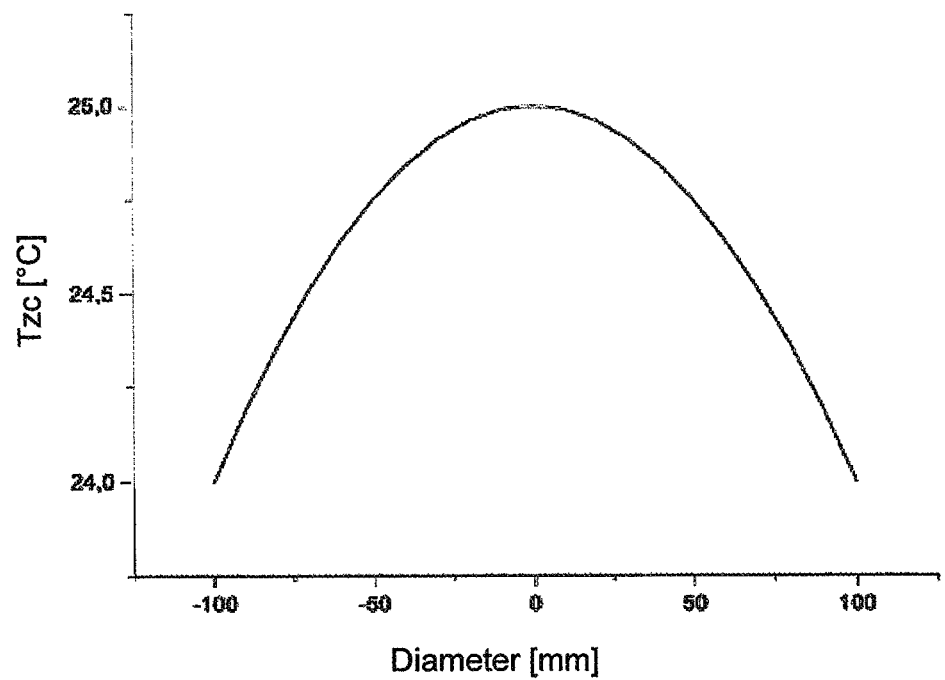
FIG. 2 is a graph of zero crossing temperature v. diameter of a substrate corresponding to FIG. 1.

FIG. 2 is a profile of the zero crossing temperature ($T_{zc}$) of a substrate along an axis extending through the center of the substrate, whereby the profile of the zero crossing temperature corresponds to the profile of the operating temperature of the mirror in FIG. 1. This allows minimal distortion of the mirror to be attained.

Figure 3:
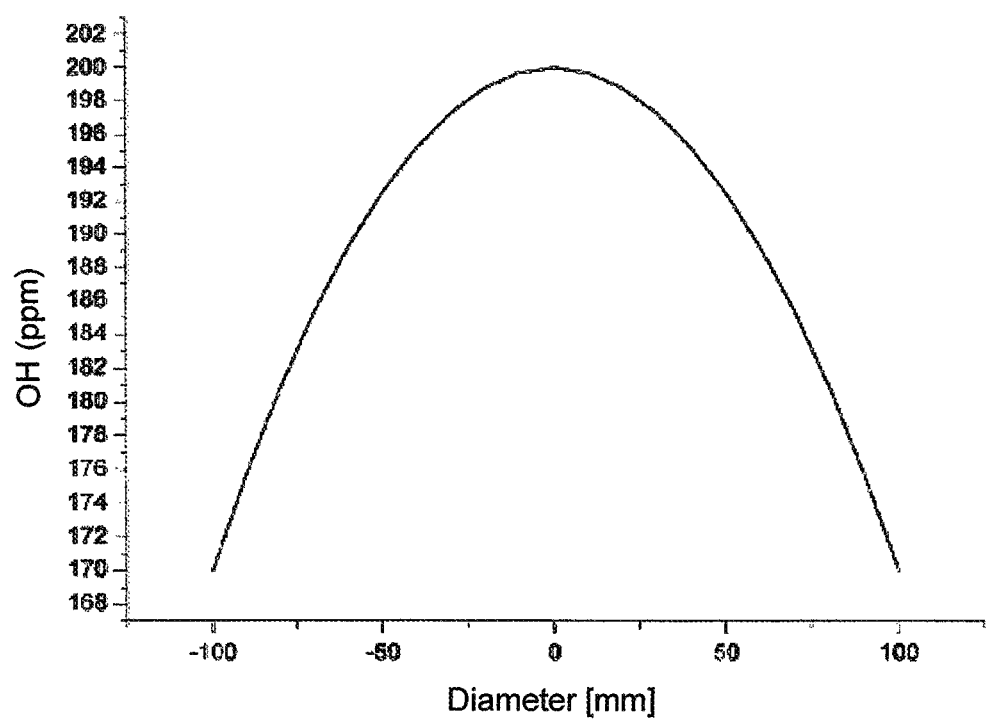
FIG. 3 is a graph of OH concentration v. diameter of a substrate corresponding to FIG. 2.

FIG. 3 is a profile of the OH content of the substrate shown in FIG. 2 along an axis extending through the center of the substrate. The profile of the OH content can be adjusted by targeted drying of the $SiO_2$ soot body. In this case, it is of advantage for the profile for the fictive temperature ($T_f$) of the substrate to be as flat as possible in order to prevent any negative, i.e., opposite, influence of the fictive temperature on the OH content. This flat profile of the fictive temperature can be attained, for example, by heat treatment, i.e., through a long dwell time at a constant temperature.

Figure 4:
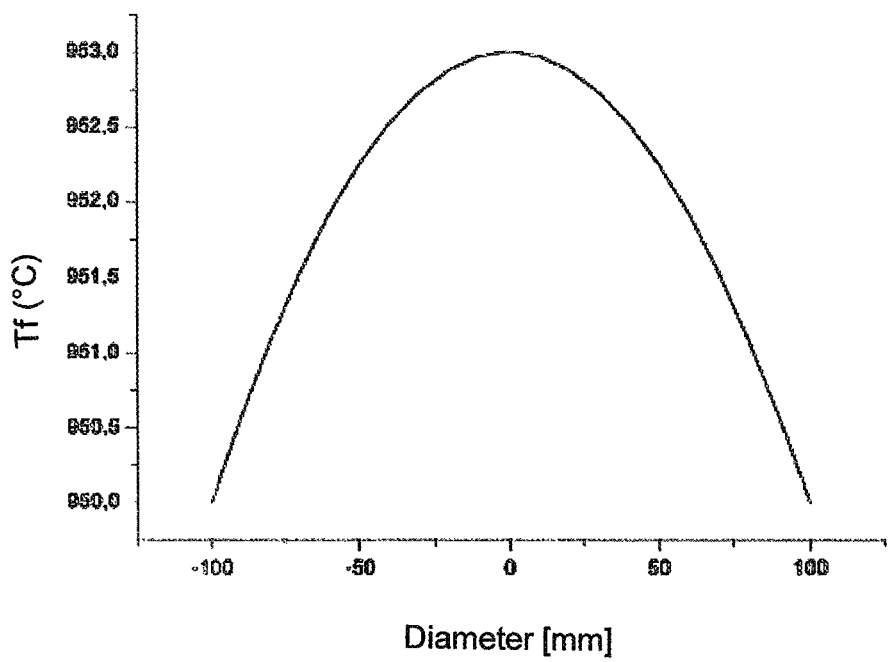
FIG. 4 is a graph of fictive temperature v. diameter of a substrate according to an embodiment of the invention.

As mentioned above, the profile of the zero crossing temperature in the substrate can alternatively by defined through the fictive temperatures in the substrate. FIG. 4 is a profile of the fictive temperature of a substrate along an axis extending through the center of the substrate that comprises a zero crossing temperature profile like the one shown in FIG. 2. A decrease of the fictive temperature profile towards the outside, as shown in FIG. 4, can be attained, for example, by insulating the circumference of the substrate, for example through heat treatment rings, during the cooling process. Alternatively, the larger surfaces of the substrate, in particular the upper surface, can be force-cooled by a stream of air and a higher fictive temperature can thus be adjusted. Moreover, it is feasible to exert an influence on the lateral profile of the fictive temperature by using cover plates or sand baths. Accordingly, the cover plate can cover, for example, just certain regions of the surface. Likewise, the fictive temperatures can be adjusted by using cover plates differing in thickness and thus differing in insulation behavior.

The adjustment of the axial profile of the fictive temperature in the substrate can be attained, for example, through targeted utilization of heat sinks along the height of the substrate in the heat treatment furnace.

Figure 5:
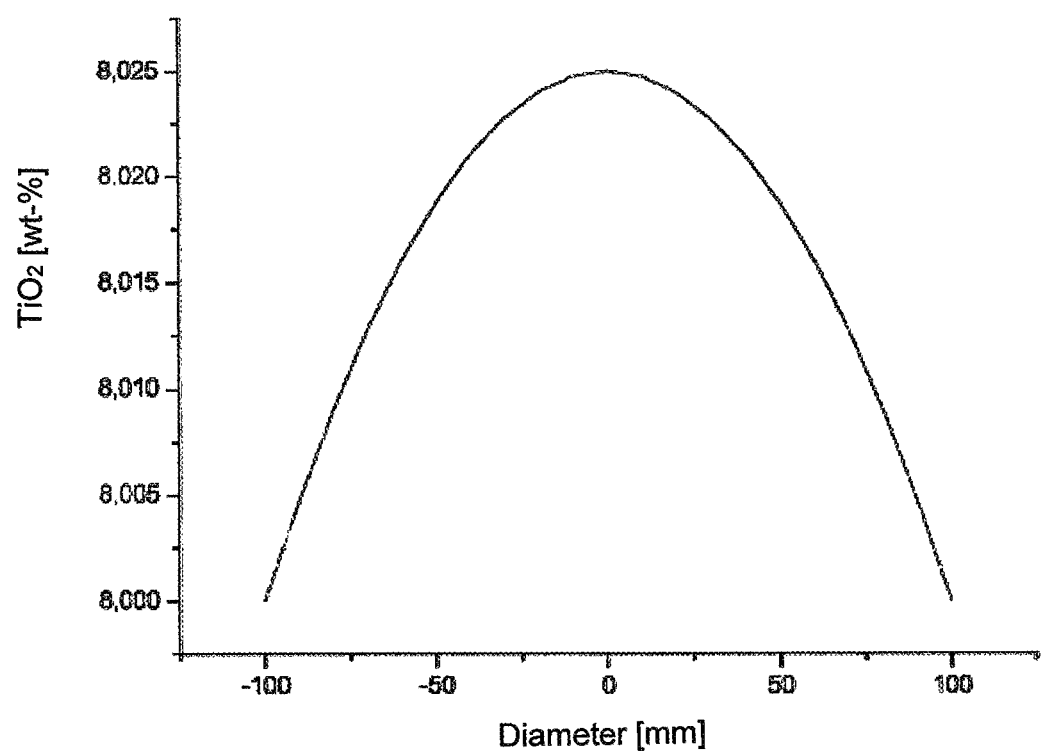
FIG. 5 is a graph of wt % $TiO_2$ v. diameter of a substrate according to a further embodiment of the invention.

FIG. 5 is a profile of the $TiO_2$ concentration of a substrate along an axis extending through the center of the substrate that comprises a zero crossing temperature profile like the one shown in FIG. 2. The $TiO_2$ concentration profile can be attained, for example, via a layered build-up of the substrate, whereby the concentration of the $TiO_2$-containing starting compound is being varied during the deposition process of the manufacturing process of the substrate.

The invention shall be illustrated based on the following examples and figures, though without these being construed such as to limit the spirit of the invention.

Example 1: Adjustment of the Distribution of the Zero Crossing Temperature by Heat Treatment with Artificial Over-Dimension A soot body doped with approx. 8% by weight $TiO_2$ was produced by flame hydrolysis of octamethylcyclotetrasiloxane (OMCTS) and titanium isopropoxide [$Ti(O^iPr)_4$] as starting substances for the formation of $SiO_2$—$TiO_2$ particles by the OVD method.

The soot body was dehydrated at a temperature of 1,150° C. in a heat treatment furnace in a vacuum using a heating element made of graphite. The dehydration treatment was completed after 2 hours.

Then, the thus dried soot body was vitrified in a sintering furnace at a temperature of approx. 1,500° C. at reduced pressure ($10^{-2}$ mbar) into a transparent blank made of $TiO_2$—$SiO_2$ glass. The mean OH content of the glass was approximately 170 ppm by weight.

Subsequently, the glass was homogenized through thermal mechanical homogenization (twisting) and formation of a cylinder made of $TiO_2$—$SiO_2$ glass. For this purpose, a rod-shaped starting body was clamped into a glass lathe fitted with an oxyhydrogen burner and homogenized by a reforming process like the one described in EP 673 888 A1 for the purpose of complete removal of layers. In this context, the starting body was heated locally by the oxyhydrogen burner to more than 2,000° C. and softened in the process. In this context, 1.8 mol hydrogen per 1 mol oxygen were supplied to the oxyhydrogen burner, effectively generating an oxyhydrogen flame with an oxidizing effect.

Relative motion of the two brackets with respect to each other was used to twist the starting body about its longitudinal axis, whereby the softened glass mass was mixed intensively in radial direction while forming a twisted body. By this means, an elongated twisted body with a diameter of approx. 90 mm and a length of approx. 635 mm was obtained.

Subsequently, a round plate made of $TiO_2$—$SiO_2$ glass having a diameter of 30 cm and a thickness of 5.7 cm was formed from this blank.

In order to relieve mechanical tensions and to adjust a pre-defined fictive temperature, the glass plate was subjected to a heat treatment. In this context, the fictive temperature was to be lower at the edge of the blank than in the center in order to attain a lower zero crossing temperature of the expansion coefficient on the outside. For this purpose, the front side and the outermost 50 mm along the circumference of the blank were insulated with auxiliary pieces of quartz glass, which were 50 mm in thickness, and were thus incorporated into a heat treatment furnace. In this context, the glass plate was heated to 1,080° C. for a dwell time of 8 hours in air and at atmospheric pressure, and subsequently the glass plate was cooled down to a temperature of 850° C. at a cooling rate of 4° C./h. During this cooling process, the fictive temperature can relax longer (more deeply) in the marginal region of the blank than in the center of the surface due to the insulation, which attains the desired distribution. Subsequently, the TiO$_2$—SiO$_2$ glass plate was cooled down to a temperature of 300° C. at a higher cooling rate of 50° C./h, upon which the furnace was shut off and the glass plate was left to cool along with the furnace.

For further processing, a surface layer of the glass plate was removed by mechanical processing such that the resulting diameter was 29.4 cm and the resulting thickness d was 5.1 cm.

The plate thus obtained consisted of very high-quality homogenized glass with a high silicic acid content containing 8% by weight titanium oxide. The OH content was 170 ppm by weight. The mean fictive temperature measured across the entire thickness was 968° C. and decreased by 6° C. towards the edge. Accordingly, the zero crossing temperature decreased radially from the center towards the outside by 2° C.

Example 2: Adjustment of the Distribution of the Zero Crossing Temperature by Adapting the Titanium Oxide Distribution A soot body was produced by flame hydrolysis of octamethylcyclotetrasiloxane (OMCTS) and titanium isopropoxide [Ti(O$^i$Pr)$_4$] as starting substances for the formation of SiO$_2$—TiO$_2$ particles by the OVD method. During the build-up, the fraction of the titanium precursor [Ti(O$^i$Pr)$_4$] was reduced appropriately such that the TiO$_2$ concentration was 8.20% at the onset and decreased over time such that it was only 8.05% at the end.

The soot body was dehydrated at a temperature of 1,150° C. in a heating furnace in a vacuum using a heating element made of graphite. The dehydration treatment was completed after 2 hours.

Then, the thus dried soot body was vitrified in a sintering furnace at a temperature of approx. 1,500° C. at reduced pressure (10$^{-2}$ mbar) into a transparent blank made of TiO$_2$—SiO$_2$ glass. The mean OH content of the glass was approximately 180 ppm by weight.

The glass was subsequently homogenized analogous to Example 1. An elongated twisted body with a diameter of approx. 90 mm and a length of approx. 620 mm was obtained. The homogenization rendered the distribution of titanium oxide rotationally symmetrical. Due to the gradient of the titanium oxide concentration in the blank, the titanium oxide distribution decreased radially from the center towards the outside by 0.05%. The extent of the decrease can be adjusted easily during flame hydrolysis.

Subsequently, a round plate made of TiO$_2$—SiO$_2$ glass having a diameter of 30 cm and a thickness of 5.5 cm was formed from this blank.

In order to relieve mechanical tensions and to adjust a pre-defined fictive temperature, the glass plate was subjected to a heat treatment. In this context, the glass plate was heated to 1,080° C. for a dwell time of 8 hours in air and at atmospheric pressure and subsequently cooled down to a temperature of 950° C. at a cooling rate of 4° C./h. The plate was kept at this temperature for 4 h in order to prevent local variations of the fictive temperature. Subsequently, the TiO$_2$—SiO$_2$ glass plate was cooled down to a temperature of 300° C. at a higher cooling rate of 50° C./h, at which time the furnace was shut off and the glass plate was left to cool along with the furnace.

For further processing, a surface layer of the glass plate was removed by mechanical processing such that the resulting diameter was 28.6 cm and the resulting thickness d was 5.0 cm.

The plate thus obtained consisted of very high-quality homogenized glass with a high silicic acid content containing a mean of 8.11% by weight titanium oxide. The titanium oxide fraction decreased radially from the center towards the outside by 0.05%. The OH content was 180 ppm by weight. The mean fictive temperature measured across the entire thickness was 972° C. and decreased by less than 1° C. towards the edge. Accordingly, the zero crossing temperature decreased radially from the center towards the outside by 2.2° C.

It will be appreciated by those skilled in the art that changes could be made to the embodiments described above without departing from the broad inventive concept thereof. It is understood, therefore, that this invention is not limited to the particular embodiments disclosed, but it is intended to cover modifications within the spirit and scope of the present invention as defined by the appended claims.

We claim:

1. A substrate for an EUV mirror, wherein the substrate comprises a surface, wherein the substrate comprises zero crossing temperatures at the surface which depart from a statistical distribution, and wherein the substrate comprises a minimal zero crossing temperature ($T_{zcmin}$) and a maximal zero crossing temperature ($T_{zcmax}$) at the surface which differ from each other by more than 1.5 K;
    wherein the substrate comprises a zero crossing temperature $T_{zc1}$ in regions far from an edge and a zero crossing temperature $T_{zc2}$ at the edge, wherein $T_{zc1}$ is at least 1.5° C. higher than $T_{zc2}$; wherein a profile of the zero crossing temperature across the surface of the substrate is adapted to the profile of the operating temperature of the mirror;
    wherein an OH profile across the surface of the substrate corresponds to the zero crossing temperature profile across the surface of the substrate; and
    wherein a profile of a fictive temperature across the surface of the substrate corresponds to the zero crossing temperature profile across the surface of the substrate.

2. The substrate according to claim 1, wherein the substrate comprises titanium oxide-doped quartz glass.

3. The substrate according to claim 1, wherein the substrate comprises 5% by weight to 12% by weight titanium dioxide relative to a total weight of the substrate.

4. The substrate according to claim 1, wherein the substrate comprises multiple layers.

5. The substrate according to claim 1, wherein the difference between $T_{zcmax}$ and $T_{zcmin}$ is at least 2 K.

6. The substrate according to claim 5, wherein the difference between $T_{zcmax}$ and $T_{zcmin}$ is in a range of from 2 to 10 K.

7. The substrate according to claim 1, wherein the distribution of the zero crossing temperature comprises, at least partly, an essentially steady profile.

8. An EUV mirror comprising the substrate according to claim 1.

9. The mirror according to claim 8, wherein the profile of the zero crossing temperature across the surface of the substrate is adapted to a profile of the operating temperature of the mirror.

10. A method for producing a substrate for an EUV mirror, comprising the following steps:
   a) pre-defining an inhomogeneous nominal temperature profile of a zero crossing temperature for the substrate; and
   b) producing the substrate while adjusting a pre-defined location-dependent nominal profile of the zero crossing temperature, wherein the profile of the nominal temperature extends laterally;
   wherein the substrate comprises a surface, wherein the substrate comprises zero crossing temperatures at the surface which depart from a statistical distribution, and wherein the substrate comprises a minimal zero crossing temperature ($T_{zcmin}$) and a maximal zero crossing temperature ($T_{zcmax}$) at the surface which differ from each other by more than 1.5 K;
   wherein the substrate comprises a zero crossing temperature $T_{zc1}$ in regions far from an edge and a zero crossing temperature $T_{zc2}$ at the edge, wherein $T_{zc1}$ is at least 1.5° C. higher than $T_{zc2}$; wherein a profile of the zero crossing temperature across the surface of the substrate is adapted to the profile of the operating temperature of the mirror;
   wherein an OH profile across the surface of the substrate corresponds to the zero crossing temperature profile across the surface of the substrate; and
   wherein a profile of a fictive temperature across the surface of the substrate corresponds to the zero crossing temperature profile across the surface of the substrate.

11. The method according to claim 10, wherein step (b) comprises:
   i) depositing silicon-containing starting substances and titanium-containing starting substances while forming a $TiO_2$-doped soot body;
   ii) drying the soot body;
   iii) sintering the soot body while forming a blank;
   iv) homogenizing the blank; and
   v) optionally forming a substrate.

12. The method according to claim 11, wherein the starting substances are deposited layer-by-layer on a cylinder-shaped blank.

13. The method according to claim 11, wherein the quantity of the titanium-containing starting substance is varied during the deposition process.

14. The method according to claim 13, wherein the adjustment of the distribution of the zero crossing temperature is effected through doping with titanium oxide which departs from a statistical distribution.

15. The method according to claim 10, wherein the adjustment of the distribution of the zero crossing temperature is effected through a distribution of an OH content in the soot body which departs from a statistical distribution.

16. The method according to claim 10, wherein the adjustment of the distribution of the zero crossing temperature is effected through a distribution of a halogen co-doping agent which departs from a statistical distribution.

17. The method according to claim 10, wherein the adjustment of the distribution of the zero crossing temperature is effected through fictive temperatures of the substrate.

18. The method according to claim 17, wherein the adjustment of the fictive temperatures is effected through heat treatment with rings, artificial over-dimensioning and/or forced cooling.

19. An EUV mirror produced by the method according to claim 10.

20. A lithography method comprising the following steps:
   a) providing an EUV mirror having a substrate; and
   b) providing at least one light source, which acts on the EUV mirror during operation, wherein the substrate comprises zero crossing temperatures at the surface which depart from a statistical distribution, and wherein the substrate comprises a minimal zero crossing temperature ($T_{zcmin}$) and a maximal zero crossing temperature ($T_{zcmax}$) at the surface which differ from each other by more than 1.5 K;
   wherein the substrate comprises a zero crossing temperature $T_{zc1}$ in regions far from an edge and a zero crossing temperature $T_{zc2}$ at the edge, wherein $T_{zc1}$ is at least 1.5° C. higher than $T_{zc2}$;
   wherein a distribution of the zero crossing temperature across the surface of the substrate is adapted to a distribution of an operating temperature of the mirror;
   wherein an OH profile across the surface of the substrate corresponds to the zero cross temperature profile across the surface of the substrate; and
   wherein a profile of a fictive temperature across the surface of the substrate corresponds to the zero crossing temperature profile across the surface of the substrate.

* * * * *